United States Patent
Hench et al.

(10) Patent No.: US 7,053,705 B2
(45) Date of Patent: May 30, 2006

(54) MIXED-MODE (CURRENT-VOLTAGE) AUDIO AMPLIFIER

(75) Inventors: John J. Hench, Los Gatos, CA (US); Joseph Comparetto, Santa Cruz, CA (US)

(73) Assignee: Tymphany Corporation, Cupertino, CA (US)

( * ) Notice: Subject to any disclaimer, the term of this patent is extended or adjusted under 35 U.S.C. 154(b) by 144 days.

(21) Appl. No.: 10/744,663

(22) Filed: Dec. 23, 2003

(65) Prior Publication Data

US 2005/0134374 A1   Jun. 23, 2005

(51) Int. Cl.
*H03F 1/36* (2006.01)
(52) U.S. Cl. ............................ 330/102; 330/103; 381/96
(58) Field of Classification Search ............... 330/102, 330/103, 107, 109; 381/96, 121
See application file for complete search history.

(56) References Cited

U.S. PATENT DOCUMENTS

| | | | |
|---|---|---|---|
| 3,820,036 A | 6/1974 | Akiyama | 330/293 |
| 3,872,247 A | 3/1975 | Saville et al. | 381/96 |
| 3,972,002 A | 7/1976 | Aprille, Jr. | 330/294 |
| 4,335,274 A | 6/1982 | Ayers | 381/96 |
| 4,393,353 A * | 7/1983 | Minagawa | 330/102 |
| 4,980,920 A | 12/1990 | Noro et al. | 381/96 |
| 5,086,473 A | 2/1992 | Erath | 381/96 |
| 5,493,620 A | 2/1996 | Pulfrey | 381/96 |
| 5,761,316 A | 6/1998 | Pritchard | 381/61 |
| 5,764,781 A | 6/1998 | Ding | 381/96 |
| 6,104,817 A | 8/2000 | Ding | 381/96 |
| 6,400,221 B1 * | 6/2002 | Brown, Sr. | 330/86 |
| 6,441,685 B1 | 8/2002 | MacMillan | 330/10 |

OTHER PUBLICATIONS

P.G. L. Mills and M.O. J. Hawksford, Distortion Reduction in Moving-Coil Loudspeaker Systems Using Current-Drive Technology, J. Audio Eng. Soc., vol. 37, No. 3, Mar. 1989.
Marchand Electronics Inc., PM224 Installation Instructions REV 0901,2002, pp. 1-9., www.marchandelec.com.
Elliot Sound Products, Variable Amplifier Impedance, Project 56, Apr. 22, 2002. pp. 1-7, http://sound.westhost.com/project56.htm.

* cited by examiner

*Primary Examiner*—Steven J. Mottola
(74) *Attorney, Agent, or Firm*—David N. Lathrop, Esq.; Gallagher & Lathrop

(57) ABSTRACT

A method and system for providing a mixed-mode (current- and voltage-source) audio amplifier is disclosed. The mixed-mode amplifier includes a voltage sensing feedback path including a first network comprising at least one circuit; and a current sensing feedback path including a second network comprising at least one circuit. According to the method and system disclosed herein, the first and second networks vary an output impedance or transconductance of the amplifier as a function of frequency of the input voltage signal, such that at a first frequency range, the amplifier operates substantially as a current amplifier, and at a second frequency range, the amplifier operates substantially as a voltage amplifier, thereby inheriting distortion reduction of the current amplifier and stability of the voltage amplifier.

42 Claims, 16 Drawing Sheets

MIXED-MODE (CURRENT-VOLTAGE) AUDIO AMPLIFIER

FIELD OF THE INVENTION

The present invention relates to audio amplifiers and more particularly to a mixed-mode (current-voltage) audio amplifier for reducing nonlinear distortion of an electrodynamic driver.

BACKGROUND OF THE INVENTION

Audio reproduction systems are used in a variety of applications including radio receivers, stereo equipment, speakerphone systems, and a number of other environments. Audio reproduction systems take signals representing audio information and convert them to sound waves. The most common means of converting electrical energy to acoustical energy in sound systems is what is known as an electrodynamic driver, which operates according to the forces generated when an electric current interacts with a magnetic field.

Distortion is a measure of the error in the output of an audio reproduction system which characterized by the extent to which the acoustical signal does not follow a linear transformation of the electrical input to the degree of accuracy desired.

Two of the major sources of distortion in the process of converting audio information into sound are related to two processes with similar names: one is called a transconductance and the other is called a transduction. The first process, transconductance, stated simply, is a natural process which takes a voltage input to a loudspeaker, an apparatus containing a voice coil, magnet, and diaphragm herein referred to as a driver, and converts this voltage into electrical current flowing in the voice coil. The second process, transduction, converts said current in the voice coil into the motion of the voice coil thereby moving an air mass coupled by some means such as a diaphragm connected to the voice coil.

Transconductance can be described more formally as a necessary conditioning of an audio signal to produce a transducer drive signal. The signal conditioning process may be accomplished in a digital or analog form, the common method is to convert the audio signal to a voltage level, and then use this voltage to drive the impedance of the voice coil, providing current through the coil. This current then results in coil/diaphragm motion (electromechanical transduction). The signal conditioning may utilize a linear amplifier, in which one voltage signal is converted to another with greater driving power.

Unfortunately, distorting factors due to nonlinear effects influence both of these processes, which will be explained with reference to the following figure. FIG. 1 is an illustration of a typically used electrodynamic transducer, a conventional voice coil transducer 300. The frame 301 holds the cone, or diaphragm 302. The diaphragm 302 is acted upon by voice coil 303 which acts as a motor, causing the diaphragm 302 to vibrate and create pressure waves in the ambient air. Voice coil 303 includes a coil of wire wound around a tube or former. Voice coil 303 receives an electrical current, which is acted upon by the static magnetic field developed by the permanent magnet 304 and iron assembly 305 in the annular gap 306 in which voice coil 303 rides. The additional magnetic field from voice coil 303, which is induced by the external current driven through voice coil 303, interacts with the static magnetic field due to the permanent magnet 304 and iron assembly 305 within the annular gap 306, causing the voice coil 303 to move forward (toward the listener, to the right in FIG. 3) or backward (away from listener, to the left in FIG. 3). Two concentric springs, the spider 307 and surround 308, provide suspension for the voice coil/diaphragm assembly, holding it in place in a concentric position and pulling it back to an equilibrium position when there is no signal applied to voice coil 303. A dome 309 acts as a dust cap and as a diffuser for high frequency sound. The example illustrates the general process of electromechanical transduction from which many specific implementations may be derived.

There are a number of causes of audio distortion that involve the structure and operation of the voice coil transducer 300. These are due to nonlinear effects that are an intrinsic part of voice coil transducers. These nonlinear effects are largely caused by the nonlinearities in the coil motor factor, in the restoring force factor of the coil/diaphragm assembly suspension, and in the impedance of the coil. Other nonlinear effects also contribute to the distortion.

Nonlinearities in the motor factor in a voice coil transducer result from the fact that the coil and the region of uniform static magnetic field are limited in size, coupled with the fact that the coil moves relative to the static field. The actual size of the static magnetic field region, and its size relative to the voice coil, represents engineering and economic compromises. For a voice coil in a transducer, a stronger field results in a larger motor factor, and hence a larger motive force per given coil current magnitude. As the field falls off away from the annular gap 306, the motive force is reduced. The motive force per unit coil current is defined as the motor factor, and depends on the geometry of the coil and on the shape and position of the coil with respect to the static magnetic field configuration, the latter being generated by the permanent magnet or magnets and guided by the magnetic pole structures. This motor factor is usually denoted as the Bl factor, and is a function of x, the outward displacement of the coil/diaphragm assembly away from its equilibrium position (which the transducer relaxes to after the driving audio signal ceases). As used herein, x is positive when the coil/diaphragm assembly is displaced from equilibrium in the direction of the listener, i.e., towards the front of the driver.

FIG. 2 represents data for actual parameters of a transducer from a small loudspeaker system. The large signal (LS) operating parameters shown in FIG. 2 were obtained using a commonly available laser metrology system. The magnitude of Bl is shown by curve 401 as a function of the displacement x of the coil/diaphragm assembly from the no-signal equilibrium position, which is indicated in FIG. 2 by a zero on the horizontal axis; at that position, no elastic restoring force is applied to the coil/diaphragm assembly. The unit for Bl is Newton/Ampere (or N/A). The highly non-constant nature of the Bl factors of commercial voice coil transducers as a function of signal level is recognized in the current art. As the audio signal increases in magnitude, the coil tends to move away from the region of maximal static magnetic field, and the motor factor decreases—thus effecting a less uniform coil movement and distorting the sound wave.

Referring again to FIG. 1, as pointed out above, the cone suspension is typically axially symmetric and typically includes two parts: a corrugated suspension near the coil, typically referred to as the spider 307, and the surround 308 connecting the large end of cone 302 to the frame 301 of the driver. These two suspensions together act as an effective spring, which provides a restoring force to the coil/diaphragm assembly and determines the equilibrium position of the assembly to which it relaxes when not being driven. This effective spring restoring force is again a highly non-linear function of coil/cone axial position x; that is to say, the effective spring stiffness varies significantly as a function of x. In FIG. 2, curve 402 shows a graph of K, the spring stiffness, as a function of x for the driver transducer mentioned above. Spring stiffness K is expressed in units of N/mm (i.e., Newtons per millimeter).

The mechanical equation of motion for the transducer can be approximated as a second order ordinary differential equation (ODE) in the position x of the coil/diaphragm assembly, treated as if it were a rigid piston. This is the electromechanical (or current-to-displacement) transduction equation:

$$m\frac{d^2x}{dt^2} + R_{ms}\frac{dx}{dt} + xK(x) = Bl(x)i(t) \qquad (1)$$

where m is the mass of the assembly plus a factor for the mass of air being moved; $d^2x/dt^2$ is used as the term for acceleration and dx/dt is used as the term for velocity; $R_{ms}$ represents the effective drag coefficient experienced by the assembly, mainly due to air resistance and suspension friction; K(x) is the position dependent effective spring stiffness due to the elastic suspension; Bl(x) is the position dependent motor factor; and i(t) is the time dependent voice-coil current, which relates via transconductance to the input audio signal and constitutes the control variable.

Further nonlinearities arise due to other electrodynamical effects caused by the application of the audio signal to the transducer voice-coil. Typically, current is supplied to the coil by converting the audio information into a voltage, V(t), which is imposed across the terminals of the voice coil. However, the resulting coil current varies both out of phase and nonlinearly with this voltage. The phase lag arises both because the voice coil's effective impedance has a reactive component, and because the electromechanical transduction of the coil current into coil motion through the static magnetic field induces a back-Electromotive Force (BEMF) voltage term in the coil circuit.

The imposed voltage gives rise to the drive (coil) current, which is determined via the transconductance (voltage-to-current) process, conventionally expressed by the following approximate circuit equation:

$$V(t) = i(t)R_e + L_e(x)\frac{di}{dt} + Bl(x)\frac{dx}{dt} \qquad (2)$$

where the BEMF is represented by the last term on the right hand side (a product of Bl(x) and coil velocity). The resistance of the coil is $R_e$. The coil's effective inductance, $L_e(x)$, is a function x because it depends upon the instantaneous position of the coil relative to the magnetic pole structure and its air gap. In FIG. 2, curve 403 shows a typical graph of the position dependence of coil inductance $L_e(x)$ at low audio frequencies. The units of $L_e$ are mH (milli-Henries), and the values of $L_e$ shown in curve 403 have been multiplied by a factor 10 to render the graph more readable.

There are well-recognized nonlinearities in the drive current as function of voltage caused by the dependence of both the effective coil impedance and of the motor's BEMF on the relative position of the coil to the magnet assembly. The spring stiffness of the coil/diaphragm assembly likewise depends on coil position, as does the motor factor—resulting in well-recognized sources of nonlinearity. Additionally, more gradual changes of coil impedance due to Ohmic and environmental heating cause the drive-current response to drift over time, which causes the effective acoustic gain of a voltage amplifier/driver system to drift as well. All these effects cause power and frequency dependent distortions of the audio signal.

In summary, voice coil drivers driven by voltage amplifiers in the audio range are susceptible to two main sources of nonlinearities. The first is due to the fact that the inductance of the driver, $L_e(x)$, is a non-constant function of driver cone displacement, and the second is due to the nonlinear nature of the back electromotive force, Bl(x)dx/dt, which itself is due to the fact that the motor factor of the driver is a non-constant function of driver cone displacement.

From the equation $V(t)=i(t)R_e+L_e(x)di/dt+Bl(x)dx/dt$, it can be seen that if a current-source amplifier is used that drives current, rather than a voltage—source amplifier, then several of the nonlinearities and temperature related variations associated with the transconductive process, $i(t)R_e$, $L_e(x)di/dt$, and Bl(x)dx/dt drop out. This is primarily the reason that some advocate the use of current amplifiers to reduce distortion in moving coil loudspeaker systems. It is also important to note that the transconductance equation is not independent of the transduction equation. Thus, when an audio circuit is driven by a voltage amplifier, it is described by a nonlinear coupled third order differential equation, while when an audio circuit is driven by a current amplifier, it is described by a nonlinear second order differential equation. Therefore, using a current amplifier in an audio circuit significantly simplifies the dynamics of an audio circuit. This simplification may be important in applications that attempt to eliminate the nonlinearities of the mechanical system via signal processing techniques.

Despite the distortion reducing advantages that current amplifiers have over voltage amplifiers, the fact remains that nearly all amplifiers sold today are voltage amplifiers. There are a number of reasons for this. One primary reason may be that amplifiers and loudspeaker drivers are not typically designed and built-in an integrated and optimal fashion. The operating stability and robustness of current-source amplifiers is highly dependent on the particular properties of the driver attached to it, especially inductance, while such is not case with voltage amplifiers. For example, changing the length of a speaker-to-amplifier interconnection cable, changing the type of driver, or removing the driver, all greatly affect a current amplifier. In addition, the inductance of a given driver, which depends on frequency, tends to raise the gain of current amplifiers at high-frequencies, thus jeopardizing their correct operation.

Although the effective acoustic gain of voice coil drivers driven by voltage amplifiers drifts as a function of the resistance of the driver coil, which can vary as a function of the temperature of the coil, voltage amplifiers still have a number of key advantages. One of these advantages is that the back electromotive force supplies a certain amount of mechanical damping to the speaker system. Another is that voltage amplifiers are much more stable when driving inductive loads, so their stability is improved to a great extent regardless of the type of voice-coil driver being driven. In contrast, current amplifiers have the advantage of reducing distortion, but being less stable and robust at high frequencies.

Accordingly, an amplifier referred to as a variable impedance amplifier has been proposed that exhibits characteristics of both a current amplifier and a voltage amplifier. In order to describe the variable impedance amplifier, refer now to FIGS. 3A and 3B illustrating circuit diagrams for a standard voltage amplifier and current amplifier, respectively.

Referring to FIG. 3A, the voltage amplifier 200 includes an operational amplifier 202 that has two inputs; one for power 204 and one for an input voltage signal W, which is input through resistor R2. The output of the operational amplifier 202 is amplified voltage V. The voltage amplifier 200 includes a voltage sensing feedback path 208 for sensing the voltage V applied to the driver load 206. The voltage sensing feedback path 208 comprises resistor R1 coupled to the input voltage signal W at the output of resistor R2 and the amplified voltage V. The amplified voltage V is applied to driver load 206, which has some impedance value Z. The amplified voltage V of the voltage amplifier 200 is $$V = -\left(\frac{R_1}{R_2}\right)W.$$

Referring to FIG. 3B, the current amplifier 220 is similar to the voltage amplifier 200, but includes a current sensing feedback path 222, rather than a voltage sensing feedback path 208, for sensing the current applied to the driver 224. The current sensing feedback path 222 includes a resistor R3 coupled between the input voltage signal W at the output of resistor R2 and the resistance of the driver, $R_s$. The current output by the operational amplifier 228 is $$I = -\frac{R_s + Z}{R_s}\left(\frac{R_3}{R_2}\right)W.$$

FIG. 4 is a circuit diagram illustrating a conventional variable impedance amplifier, which combines aspects of the voltage amplifier 200 and the current amplifier 220. The variable impedance amplifier 300 includes an operational amplifier 228, input power 304, voltage signal W, and driver load 306. The variable impedance amplifier 300 applies a mixture of both forms of feedback from the voltage amplifier 200 and the current amplifier 220 by including a voltage sensing feedback path 308 and a current sensing feedback path 322 operating in parallel.

By applying a mixture both forms of feedback, it is possible to define the output impedance of the amplifier 300, thereby defining a fixed percentage to which the variable impedance amplifier 300 performs as a current amplifier or a voltage amplifier during operation. To obtain some of the desirable audio properties of a vacuum tube amplifier for example, an output impedance of about 4 to 6 ohms would be needed, assuming an 8 ohm load (the assumed nominal load impedance). A designer could change the relative impedance for a given version of the variable impedance amplifier 300 by changing the values for R1 and R2 relative to the fixed driver load resistance.

There are several problems with this approach. One problem is that it was based on the assumption that the driver load 306 has fixed impedance, which is not the case. A driver will have various dips and peaks in its impedance curve as a function of frequency, as shown in FIG. 5.

FIG. 5 depicts a graph of a typical impedance curve for an audio driver. The horizontal axis represents frequency in Hertz, while the vertical axis represents impedance in ohms. As shown, the impedance curve peaks at the mechanical resonance of the driver, which typically occurs at frequencies near the lower extreme of its operating range. The impedance curve then begins to rise significantly due to the inductance of the driver, which typically occurs around 1000 Hz.

Often, driver manufactures talk of a nominal impedance, but this is a kind of average. If one designs a variable impedance amplifier 300 based on nominal impedance, then it is clear that there is improper modeling of the electrical dynamics of the driver (assuming any modeling is done at all) and the results will be less than satisfactory.

Another problem with the design of the variable impedance amplifier 300 is that because the voltage and current sensing feedback paths 308 and 322 are resistive, the output impedance of the amplifier 300 remains relatively constant for all input frequencies. A considerable improvement over the variable impedance amplifier 220 would be an amplifier having an output impedance that varies as a function of frequency to achieve a number of desirable objectives.

U.S. Pat. No. 4,393,353 issued Minagawa describes an amplifier that has both a voltage and current feedback circuits in an attempt to reduce both the voltage and current distortion that would be produced by a Class A/B power amplifier stage were feedback not to be used. This scheme is predominantly a voltage feedback system except at the resonance frequency Minagawa provides current feedback in an attempt to match the impedance of the amplifier with the impedance of the driver load at the mechanical resonance peak. This is reported to have two main advantages, first to reduce current distortion and second to obtain a more even output sound response at the mechanical resonance frequency. Although in theory the output impedance of Minagawa's amplifier appears to vary as a function of frequency, and is an improvement over the variable impedance amplifier 300, the output impedance of Minagawa's amplifier only varies in a fairly narrow range of the resonance frequency of the connected driver. It appears that Minagawa attempts to reduce what is referred to as current distortion at only the resonance frequency, which also has the added effect of increasing the output of the amplifier at the resonance frequency. When describing current distortion, therefore, Minagawa appears to focus on that distortion produced by his power amplification stage, ignoring driver distortion due to nonlinearities inherent to the driver such as the nonlinearity of BEMF, and the nonlinearity of the inductance as a function of driver displacement.

Accordingly, what is needed is an improved audio amplifier that is capable of reducing driver distortion arising from the nonlinearities inherent to the driver. The present invention addresses such a need.

SUMMARY OF THE INVENTION

The present invention provides a mixed-mode (both current- and -voltage-source) audio amplifier. The mixed-mode amplifier includes a voltage sensing feedback path, and a current sensing feedback path to achieve this operation. According to the method and system disclosed herein, the first and second networks vary an effective output impedance of the amplifier as a function of frequency of the input voltage signal, such that at a first frequency range, the amplifier operates substantially as a current amplifier, and at a second frequency range, the amplifier operates substantially as a voltage amplifier, thereby inheriting, among other things, the distortion reduction of the current amplifier the stability of the voltage amplifier. In a preferred embodiment, the first frequency range comprises audible frequencies.

According to the method and system disclosed herein, the mixed-mode audio amplifier of the present invention effectively reduces nonlinearities that arise at audio frequencies from the use of a low-impedance voltage amplifier only, such as 1) the nonlinearity of the BEMF, 2) nonlinear induction, and 3) the slow drift in resistance of the driver due to temperature changes. By making the output of a current-voltage amplifier have high impedance at audible signal frequencies where these nonlinearities present themselves, the current-voltage audio amplifier of the present invention significantly reduces such nonlinearities and parameter drifts.

DETAILED DESCRIPTION OF THE INVENTION

The present invention relates to audio amplifier design. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

This present invention provides a mixed-mode (current-voltage) audio amplifier for use that has an effective output impedance that varies as a function of input frequency from nearly zero ohms to thousands of ohms. At certain frequencies, the mixed-mode amplifier may operate with high impedance, thereby acting substantially as a current amplifier, and at other frequencies, it may operate with low impedance, thereby acting substantially as a voltage amplifier. Typically, the mixed-mode amplifier acts as a current amplifier at audible frequencies, and as a voltage amplifier at frequencies above audible frequencies. This feature of the mixed-mode amplifier enables it to retain the nonlinearity suppressing features of a current amplifier, while inheriting the robust stability characteristics of a voltage amplifier. Robust stability is defined herein as the ability to have a dynamically stable feedback system under all of the conditions under which the system is expected to operate. Voltage amplifiers, for example, tend to be robustly stable; they will maintain stability whether or not the driver is placed in the circuit or not. Current amplifiers tend not to be robustly stable; they can go unstable when the driver is removed.

The mixed-mode audio amplifier of the present embodiment effectively reduces nonlinearities that arise at audio frequencies from the use of a low-impedance voltage amplifier only, such as 1) the nonlinearity of the BEMF, the distortion derived from which is at a maximum at the peak resonance frequency of the driver, 2) the nonlinearity of the inductance of the voice coil of the driver, the distortion derived from which typically occurs at frequencies above 1 kHz, and 3) the slow drift in the gain of the audio circuit due to the variation of the resistance of the driver due to temperature changes. By making the output of a current-voltage amplifier have high impedance at audible signal frequencies where these conditions present themselves, the mixed-mode audio amplifier of the present invention significantly reduces such nonlinearities and parameter drifts.

Figure 1:
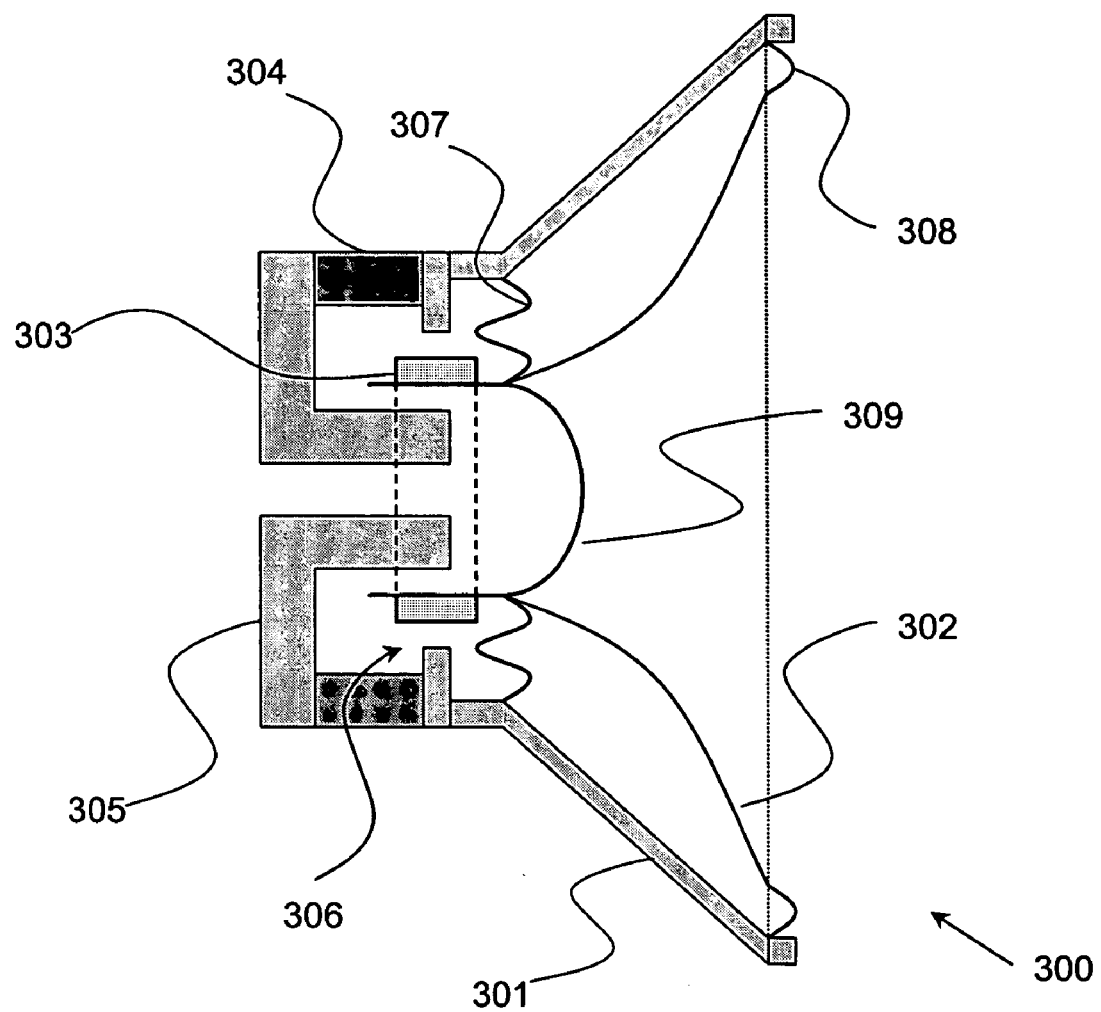
FIG. 1 is an illustration of a typical conventional voice coil transducer.
Figure 2:
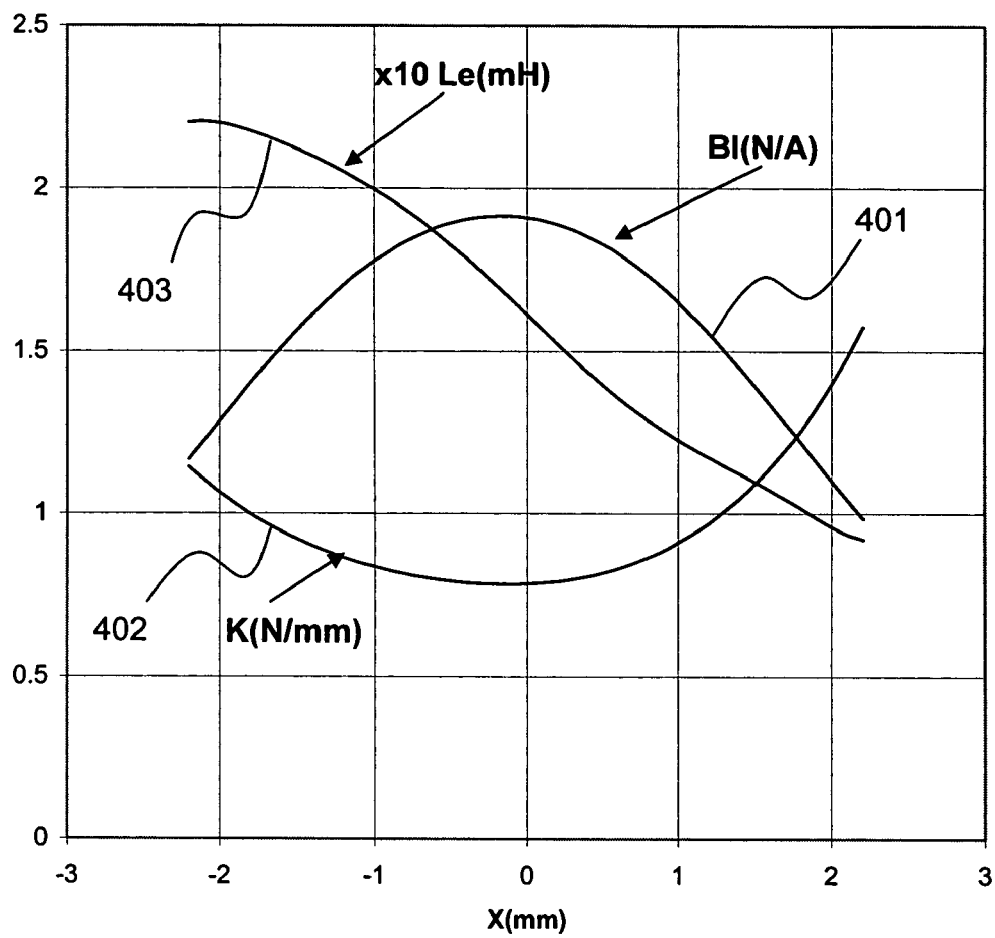
FIG. 2 represents data for actual parameters of a transducer.
Figure 3A:
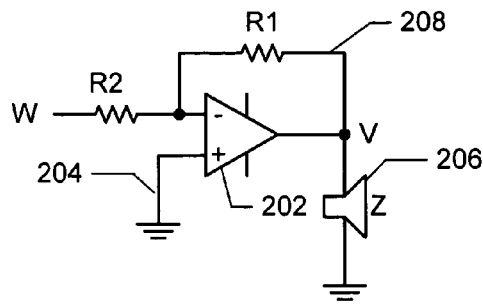
FIGS. 3A and 3B illustrate circuit diagrams for a standard voltage amplifier and current amplifier, respectively.
Figure 3B:
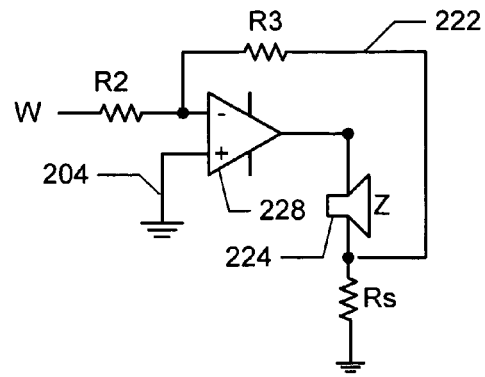
Figure 4:
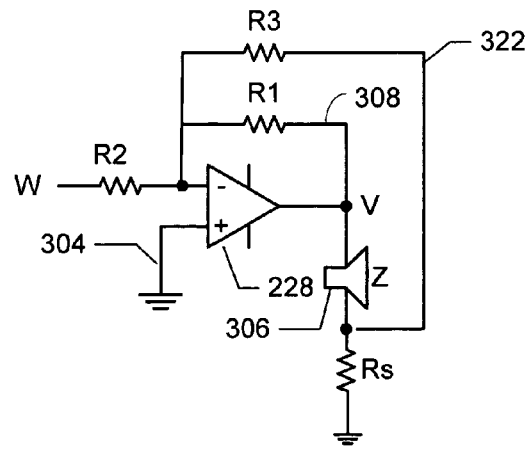
FIG. 4 is a circuit diagram illustrating a conventional variable impedance amplifier.
Figure 5:
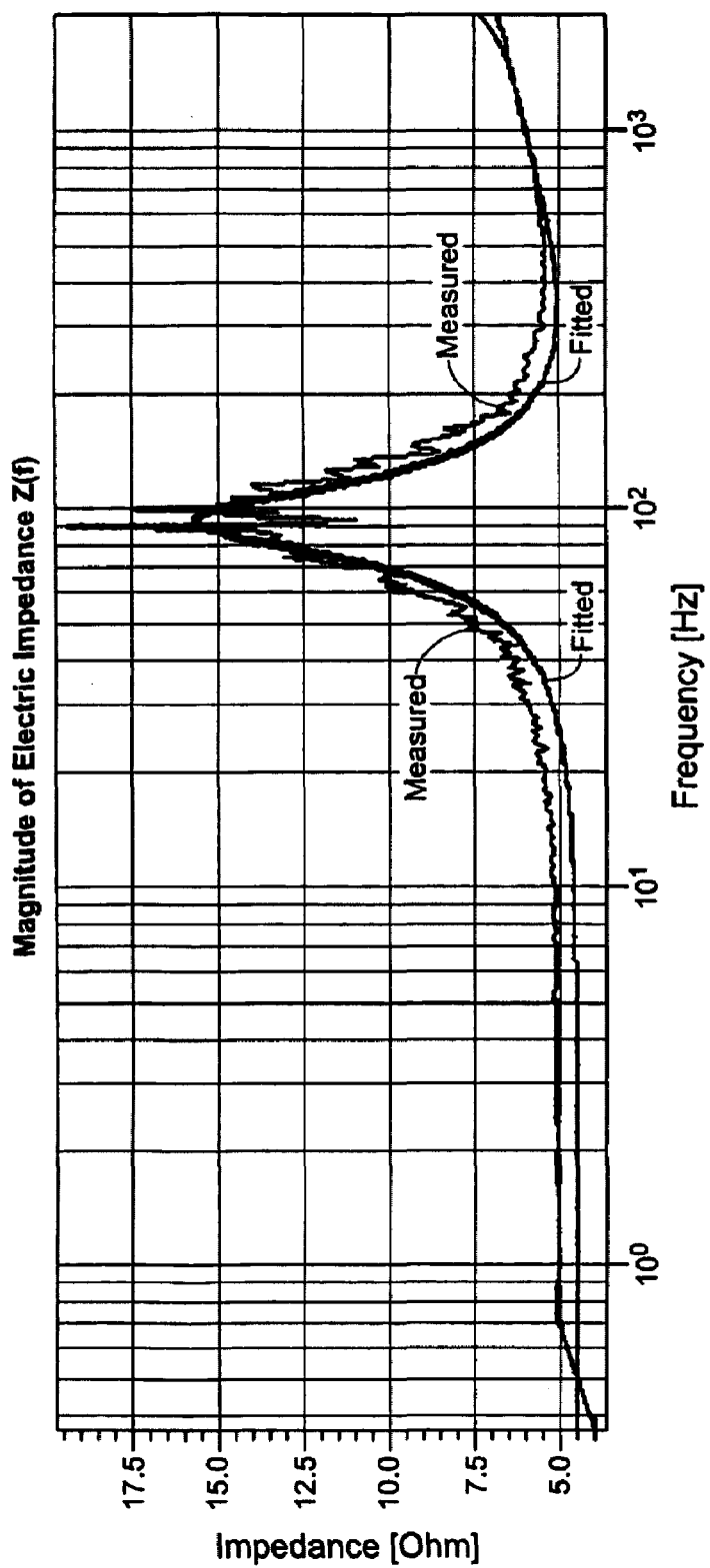
FIG. 5 depicts a graph of a typical impedance curve for an audio driver.
Figure 6A:
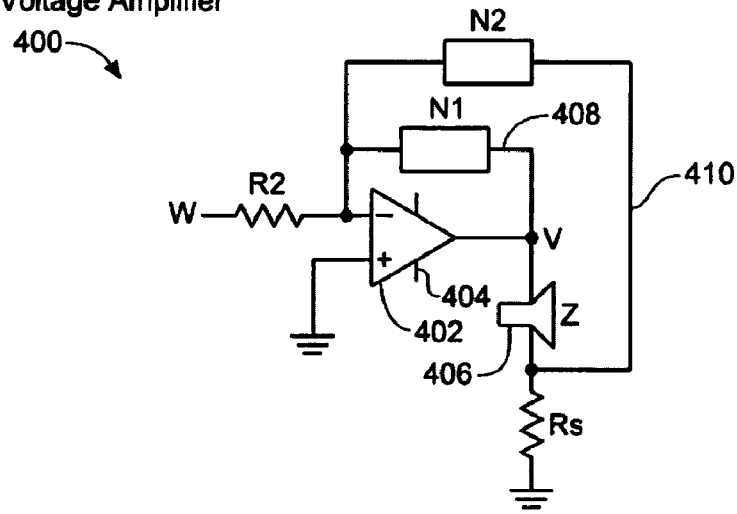
FIGS. 6A and 6B are circuit diagrams illustrating the mixed-mode current-voltage audio amplifier in a preferred embodiment of the present invention.
Figure 6B:
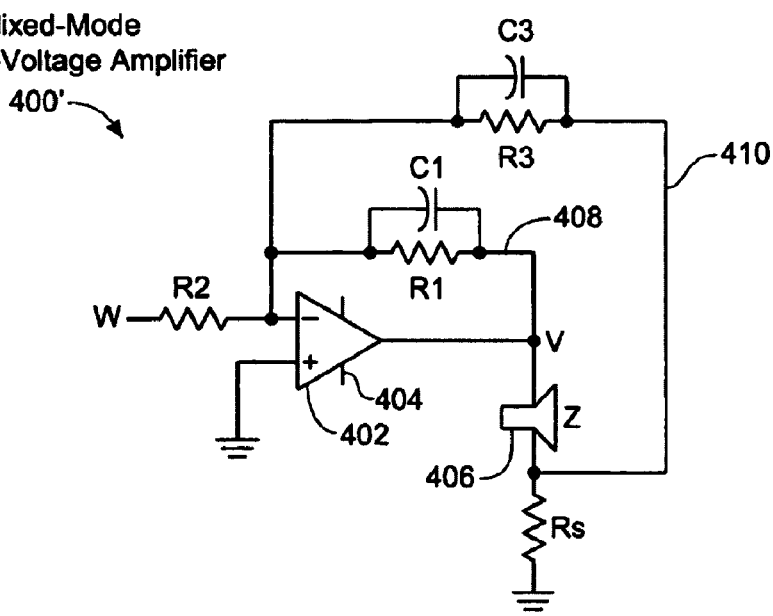

FIGS. 6A and 6B are circuit diagrams illustrating the mixed-mode audio amplifier in a preferred embodiment of the present invention. Referring to FIG. 6A, the current-voltage audio amplifier 400 includes an operational amplifier 402, which has two inputs; an input node for power 404 and an input node for an input voltage signal W, which is input through resistor R2. An output node of the operational amplifier 402 produces amplified voltage at V. The mixed-mode audio amplifier 400 also includes a voltage sensing feedback path 408 and a current sensing feedback path 410 operating in parallel. A driver load 406 is connected to the output node of the operational amplifier 400 and is grounded through a current detecting resistor $R_s$. It should be noted that the mixed-mode amplifier may be designed as a non-inverting amplifier by simply applying the input signal W to the noninverting node of the amplifier and grounding the end of the resistor R2 where the input signal is applied in the inverting mode.

According to the present invention, the voltage sensing feedback path 408 includes a network N1 that is connected in series between the input node of the operational amplifier 402 and the output node of the operational amplifier 402. The voltage sensing feedback path 408 detects the voltage at the output node of the operational amplifier 402 and feeds the detected voltage back into the input node of the operational amplifier 400. Similarly, the current sensing feedback path 410 includes a network N2 that is connected in series between the input node of the operational amplifier 402 and a point between the driver load and the current sensing resistor $R_s$. The current sensing feedback path 410 detects the current flowing through the driver load 406 and feeds the detected current back into the input node of the operational amplifier 400.

As used herein, a network is a set of one or more linear circuit elements, such has resistors, capacitors, inductors, and transformers that has two or more terminals. FIG. 6B is a circuit diagram of the mixed-mode current-voltage audio amplifier showing a preferred embodiment of networks used in the voltage and current sensing feedback paths 408 and 410. As shown, the networks in the voltage and current sensing feedback paths 408 and 410 comprise a resistor coupled in parallel with a capacitor, which is referred to as an RC network. More specifically, network N1 in the voltage sensing feedback path 408 comprises resistor R1 in parallel with capacitor C1, while network N2 in the current sensing feedback path 410 comprises resistor R3 in parallel with capacitor C3.

According to the present invention, the function of the networks N1 and N2 in this circuit is to vary the magnitude of the feedback of the voltage sensing feedback path 408 relative to the current sensing feedback path 410 as a function of frequency. Changing the relative feedback gain between current and voltage sensing paths will affect the transconductance of the output stage in such a way that the effective impedance of the amplifier 400 will vary as a function of the frequency content of the input audio signal W. For a preferred embodiment, in the audio frequencies the current sensing feedback path 410 is dominant (providing most of the feedback current to the summing node at the negative junction of the operational amplifier), thus ensuring a high output impedance of the mixed-mode amplifier. For very high frequencies, the voltage sensing feedback path 408 is dominant, thus ensuring a low output impedance of the mixed-mode amplifier. In a further aspect of the present invention, the level of feedback from the of the voltage sensing feedback path 408 and the current sensing feedback path 410 has substantially the same magnitude over certain frequency ranges of the input signal W, referred to herein as a transition frequency range.

One means of measuring the relative levels of feedback from the voltage sensing feedback path 408 and the current sensing feedback path 410 is to compute the transfer function from the input voltage signal W to the output voltage of the operational amplifier with a linear model of electrical dynamics of the driver the first with just the voltage sensing feedback path 408 in place and the second with just the current sensing feedback path 410 in place. The dominant feedback path for a given frequency is that feedback path whose transfer function has the smallest magnitude. Additionally, the frequency at which the magnitudes of these two transfer functions are equal, is referred to herein as a hand-off frequency. Designing the amplifier such that the feedback from the two paths 408 and 410 varies relative to one another as a function of frequency is what provides the amplifier the varying impedance.

Figure 7A:
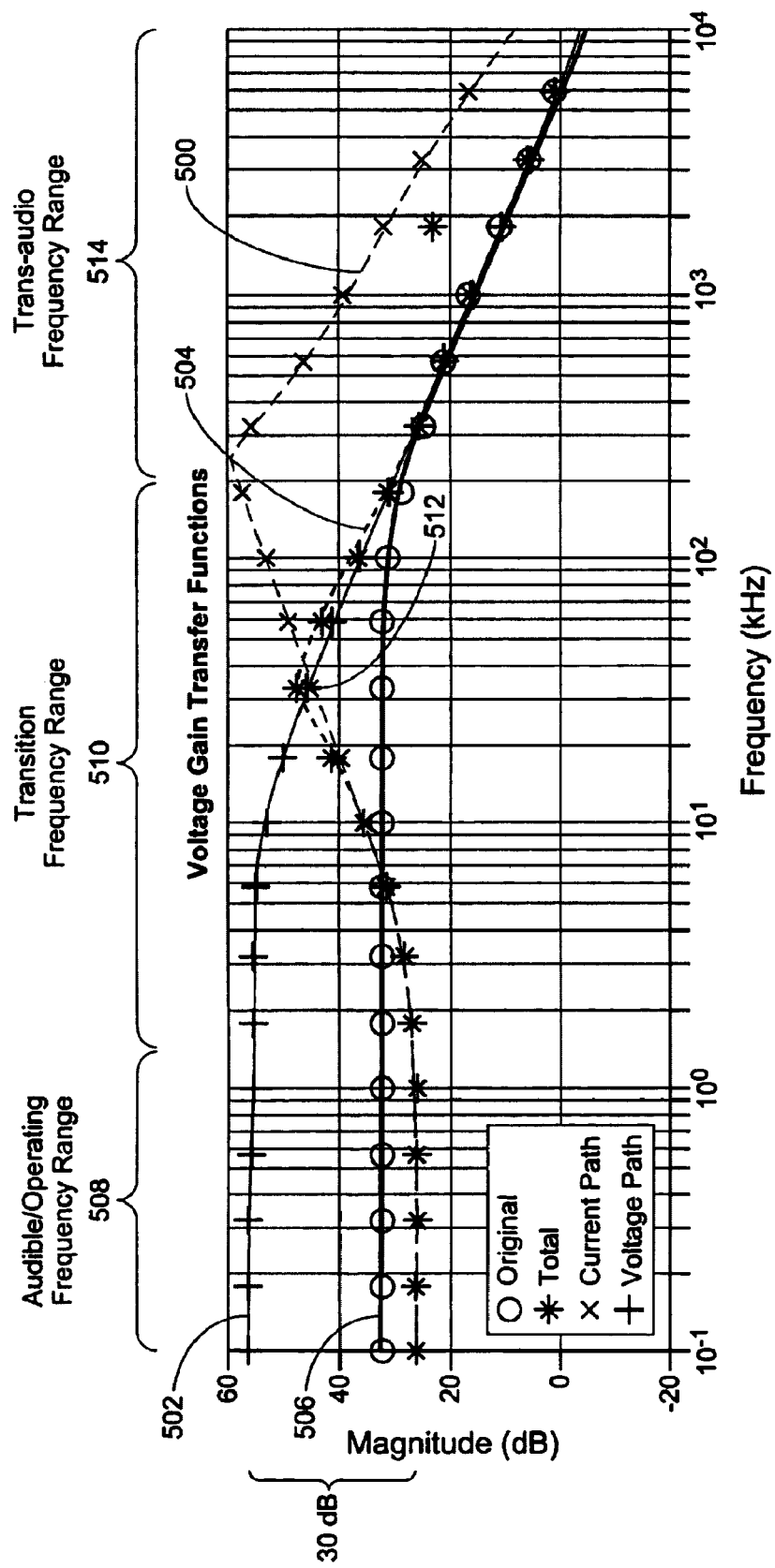
FIG. 7A is a gain versus frequency magnitude graph of the current and voltage gain transfer functions of the mixed-mode amplifier.

FIG. 7A is a gain versus frequency magnitude graph of the current and voltage gain transfer functions of the mixed-mode amplifier 400. The y-axis of the magnitude graph represents magnitude in decibels, and the x-axis represents the frequency of the input signal in kHz. The graph includes a current feedback transfer function 500, a voltage feedback transfer function 502, and a total transfer function 504 that is a sum of transfer functions 500 and 502 operating in parallel. A conventional voltage amplifier transfer function 506 is also shown for comparison. An example of a conventional voltage amplifier is the Marchand PM224 amplifier. The Marchand PM224 amplifier has a feedback transfer function 506 that is essentially a low-pass filter; the transfer function 506 it is denoted by the label "Original" in the graph.

All four transfer functions are shown extending across the frequency spectrum. The frequency spectrum is shown partitioned into three categories, an audible frequency range 508, a transition frequency range 510, and a trans-audio frequency range 514. The voltage feedback transfer function 502 is similar to the conventional voltage amplifier transfer function 506, except that the corner frequency is a slightly more than a decade lower than the original. The current feedback transfer function 500 appears to be a high-pass filter in the audible frequency range 508, but eventually rolls off in the trans-audio frequency range 514.

Although both the current feedback transfer function 500 and the voltage feedback transfer function 502 are active, over certain frequency ranges the magnitude of total transfer function 504, which is roughly the parallel sum of the two feedback paths 408 and 410, is dominated by one or the other feedback paths 408 and 410. In the audible frequency range 508 (e.g., up to approximately 20 kHz), the current feedback transfer function 500 is dominant, and the mixed-mode amplifier 400 acts as a current amplifier. In the transition frequency range 510 (e.g., 20 kHz to 50 kHz), the amplifier 400 transitions between a current amplifier and a voltage amplifier. The frequency at which the magnitude responses of the current feedback transfer function. 500 and the voltage feedback transfer function 502 are equal is the handoff frequency 512, which occurs approximately halfway through the transition frequency range 510 (e.g., 35 kHz). In the trans-audio frequency range 514, the mixed-mode amplifier 400 acts as a voltage amplifier. In a preferred embodiment of the present invention, the transition frequency range 510 is chosen to be slightly above the audible frequency range 508 so that amplifier 400 does not transition between a current amplifier and a voltage amplifier at those frequencies in the audible range.

The current transfer function 500 is shown rolling off in the trans-audio frequency range 514. The roll-off can be designed into the amplifier 400 by the well known technique of adding a high impedance snubber or other type of compensation network that includes a capacitor and resistor in series connected to the input and output nodes of the driver 406. Although not necessary for the operation of the mixed-mode amplifier, the snubber network provides more stability margin of the amplifier 400 in the case where the driver 406 is disconnected from the mixed-mode amplifier during operation.

As shown by the total sum transfer function 504, the properties of the transfer functions 500 and 502 are such that the gain of the amplifier 400 follows the minimum gain of the two transfer functions 500 and 502. The overall gain of the amplifier 400 is not related to the simple sum of the complex gain of the transfer functions 500 and 502, i.e., $G_{total} \neq G_{current} + G_{voltage}$, but as the parallel sum, i.e., $$\frac{1}{G_{total}} = \frac{1}{G_{current}} + \frac{1}{G_{voltage}}.$$

At low frequencies, the impedance of the voltage feedback path 408 is so high that only the current feedback path 410 appears active, and the gain of the total sum transfer function 504 follows the current transfer function 500. Having high impedance from 1 to 20 kHz has the advantage of significantly reducing distortion due to nonlinear inductance of typical drivers.

At frequencies higher than the handoff frequency 512, the impedance of the current feedback path 410 is much higher than the impedance of the voltage feedback path 408 so only the voltage feedback path 408 appears active, and the gain of the total sum transfer function 504 follows the voltage transfer function 502. Having low impedance above 20 kHz has the advantage of ensuring the robust stability of the mixed-mode amplifier 400 in the presence of inductive loads and/or loads with a high degree of parametric uncertainty.

Also shown in the example is that the amplifier 400 has been designed with a ratio of approximately 30 dB between the current feedback transfer function 500 and the voltage feedback transfer function 502 for frequencies outside of the transition frequency range 510. By changing the ratio of the two transfer functions 500 and 502 (i.e., the amount of current feedback versus voltage feedback), the amount of BEMF that is reduced by the amplifier 400 can be varied. The higher the ratio, the more nonlinear distortion is reduced. This can be important, for example, in the design of a subwoofer where it may be easier to produce more bass by eliminating the effect of BEMF. At no point is the ratio allowed to go to infinity in order to keep the slopes of the functions 500 and 502 flat at certain frequencies so that if the driver 406 is unplugged from the amplifier 400 during operation, the voltage gain is not so high that the amplifier 400 becomes unstable. This is what typically limits the maximum values of the ratio between the current feedback transfer function 500 and the voltage feedback transfer function 502.

Those with ordinary skill in the art will readily appreciate that the transfer functions 500 and 502 can be made to vary with frequency in a variety of ways just by the design of the networks N1 and N2. In the preferred embodiment, the voltage gain transfer functions are designed such that the magnitude of the input voltage to output current transfer function is relatively flat over the audible frequencies. On the other hand, it is quite possible to design these networks such that the magnitude of the input voltage to output voltage transfer function is relatively flat over the audible frequencies. Additionally, if desired, the amplifier 400 could be designed such that amplifier 400 acts as a voltage amplifier for frequencies up to 100 Hz, acts as a current amplifier from 100 Hz to 1000 Hz, and for frequencies higher than 100–0 Hz acts as a voltage amplifier or some mixture of the two. The difficulty in the design of the amplifier 400 is that the transfer functions 500 and 502 cannot be designed independently because if a particular design criterion is not heeded, the amplifier will become unstable. Finally, it should be noted that while the design of the amplifier is given typically in terms of input voltage to output voltage transfer functions, it is possible to define these transfer functions in three additional ways: input current to output voltage, input current to output current, and input voltage to output current. The definition to be used typically depends on such things as whether or not the input to or output from the mixed-mode amplifier is nominally a voltage or a current.

This design criterion, which is a further aspect of the present invention, is the recognition that one of the critical issues for ensuring that the mixed-mode amplifier 400 is stable is that the parallel sum of the transfer functions describing the two parallel feedback paths 408 and 410 produce a total transfer function 504 that is stable and minimum phase. Applicants have further determined the conditions under which the total sum transfer function 504 is stable and minimum phase, as described below.

Assume that the two parallel feedback paths 408 and 410 are described by transfer functions M and N, which may be modeled as a ratio of two polynomials in the s-domain. The transfer functions M and N are both stable, that is, with all of their poles in the left half-plane in the s-domain and minimum phase, that is, with all of their zeros in the left half-plane in the s-domain. Now, let P=M+N and define the transfer function L=M/N. Further, define a standard servo feedback system with loop gain L as in FIG. 7C. The necessary and sufficient condition for P to be minimum phase is as follows:

1. P=M+N is stable and minimum phase if and only if L=M/N is stable under feedback.

A sufficient condition follows directly from this statement:

2. P=M+N is stable, minimum phase when max($\Phi$(M)−$\Phi$(N))<180

Here $\Phi(\cdot)$ denotes the operator that returns the phase of the transfer function in degrees. In other words, if M and N are minimum phase and can be designed such that their relative phases are less than 180 degrees, then their sum will also be minimum phase. It may be easily shown that the conditions for minimum phase and stability for parallel sums of feedback transfer functions 408 and 410 is the same as the condition for minimum phase and stability for simple sums of the feedback transfer functions 408 and 410. If the parallel sum Q of two transfer functions M and N is defined as $$\frac{1}{Q} = \frac{1}{M} + \frac{1}{N} \text{ then } Q = \frac{MN}{M+N}$$

will be stable and minimum phase if and only if M+N is stable and minimum phase. Thus, the conditions stated above in 1. and 2. apply, giving the conditions under which the parallel sum of the two feedback paths 408 and 410 will be minimum phase. This is shown in FIG. 7B.

Figure 7B:
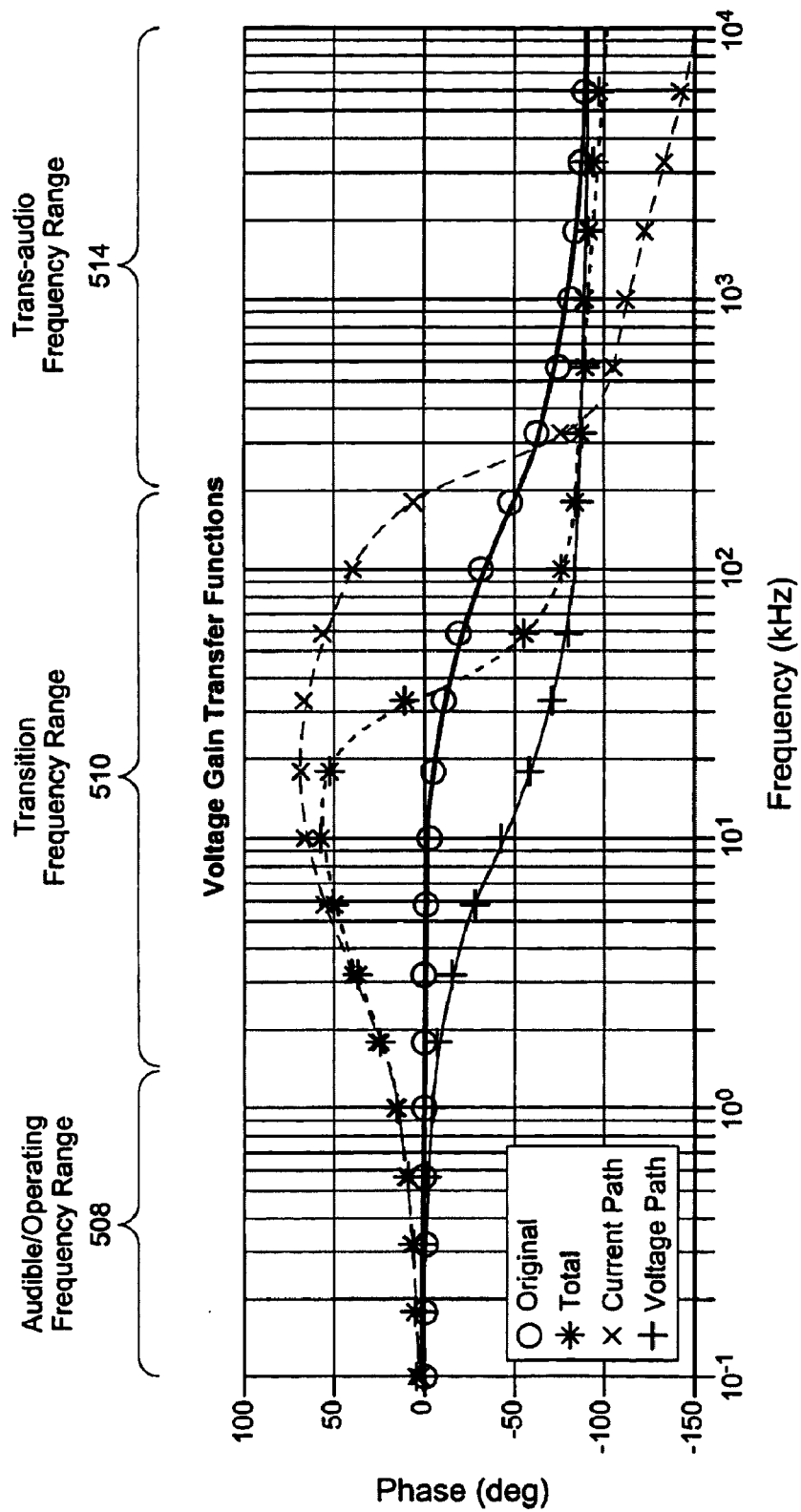
FIG. 7B is a phase versus frequency graph of the current and voltage transfer functions of the mixed-mode amplifier.
Figure 7C:
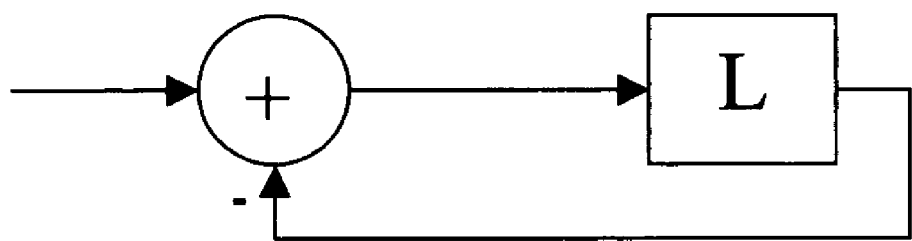
FIG. 7C is a diagram showing a transfer function, known as a loop gain, being connected in feedback.

FIG. 7B is a phase versus frequency graph of the current and voltage transfer functions of the mixed-mode amplifier 400. The y-axis of the graph represents phase in degrees, and the x-axis represents the frequency of the input signal in kHz. The graph shows the phases of current feedback transfer function 500, the voltage feedback transfer function 502, the total transfer function 504, and the conventional voltage amplifier transfer function 506 as a function of frequency.

At their widest point of separation, the phases of the current transfer function 500 and the voltage transfer function 502 are approximately 120 degrees apart. Note, too, that the phase of the total sum transfer function 504 of the parallel paths stays between the phase of current and voltage transfer functions 500 and 502 taken singly; this is evidence that the two transfer functions 500 and 502 sum to form a minimum phase transfer function. Note that in FIG. 7A, the slopes of the transfer functions 500 and 502 at the hand-off frequency 512 (about 35 kHz) are approximately first order. This ensures that the phases near the hand-off frequency are less than 180 degrees, as shown in the graph in FIG. 7B.

Figure 8:
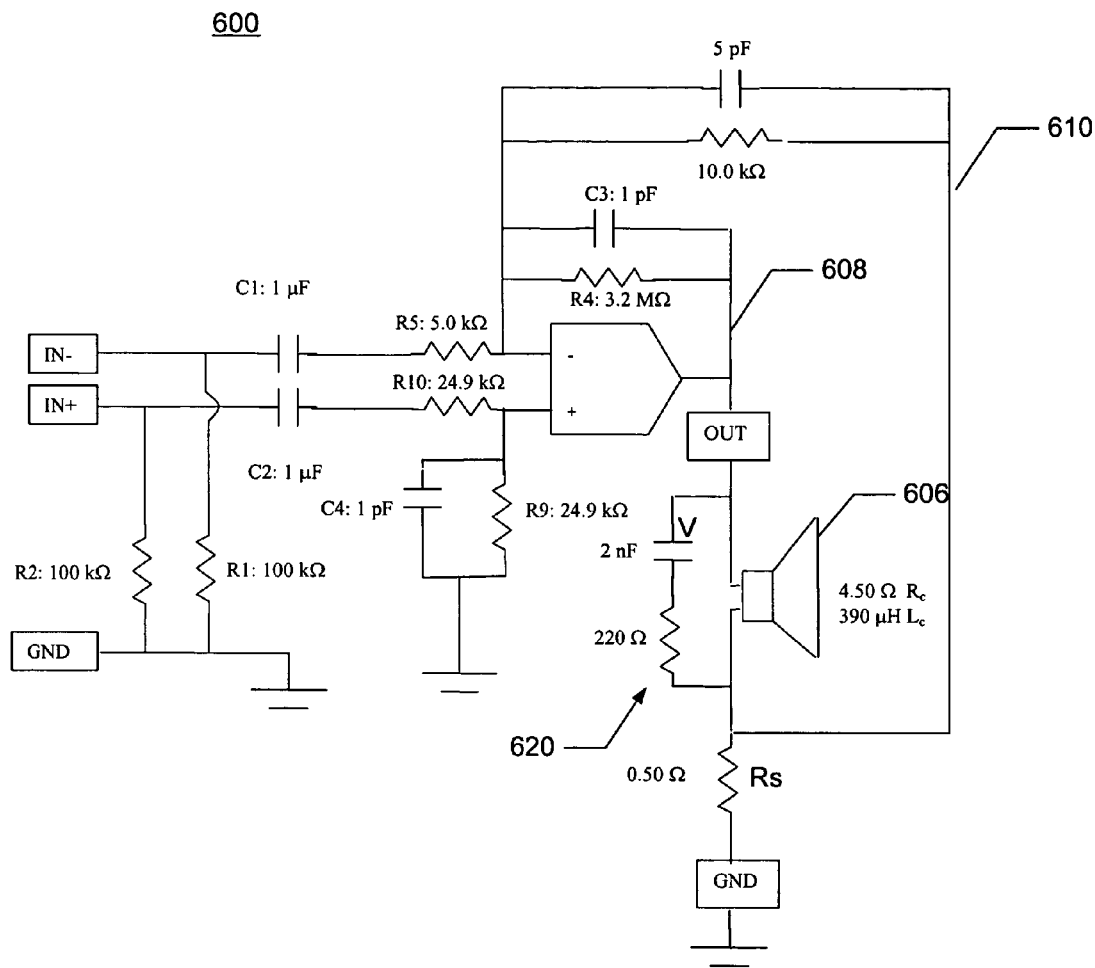
FIG. 8 is a diagram of a particular implementation of the mix-mode amplifier.

FIG. 8 is a diagram of a particular implementation of the mixed-mode amplifier that produces the current transfer function 500, the voltage transfer function 502, and the total transfer function 504 of FIGS. 7A and 7B. The amplifier 600 was produced by modifying the Marchand PM224 amplifier. The voltage sensing feedback path 608 and the current sensing feedback path 610 are also operating in parallel.

First, note that the driver 606 has a resistance of 4.5 $\Omega$, and the current is sensed by the current sensing feedback path 860 by a 0.5 Ω resistor, $R_s$, and then fed back through an RC circuit. In a preferred embodiment, the value of the sense resistor $R_s$ is such that the ratio of the resistance of the driver 606 and the sense resistor is 9:1. This ratio is low enough to ensure that the signal to noise ratio of the current sensing voltage is high while being high enough to prevent an unnecessarily high amount of power to be dissipated in the sense resistor.

Also shown is a snubber network 620 around the driver 606 comprising a third RC network having a resistor in series with a capacitor. The snubber network 620 provides the amplifier 600 with stability at high frequencies in the case that the voltage feedback path 608 is removed. The snubber network accomplishes this by rolling-off the gain of the current feedback path 610 at high frequencies. As can be expected, the voltage feedback path 608 provides stability if the driver 606 is removed.

Another aspect of the amplifier 600 to note is that the DC gain is approximately 6 dB lower than the original Marchand PM224 amplifier. The gain was lowered based on simulations of the driver 606, which indicated that the peak voltage output for a current amplifier is approximately double that of a voltage amplifier for a typical music sequence.

Figure 9:
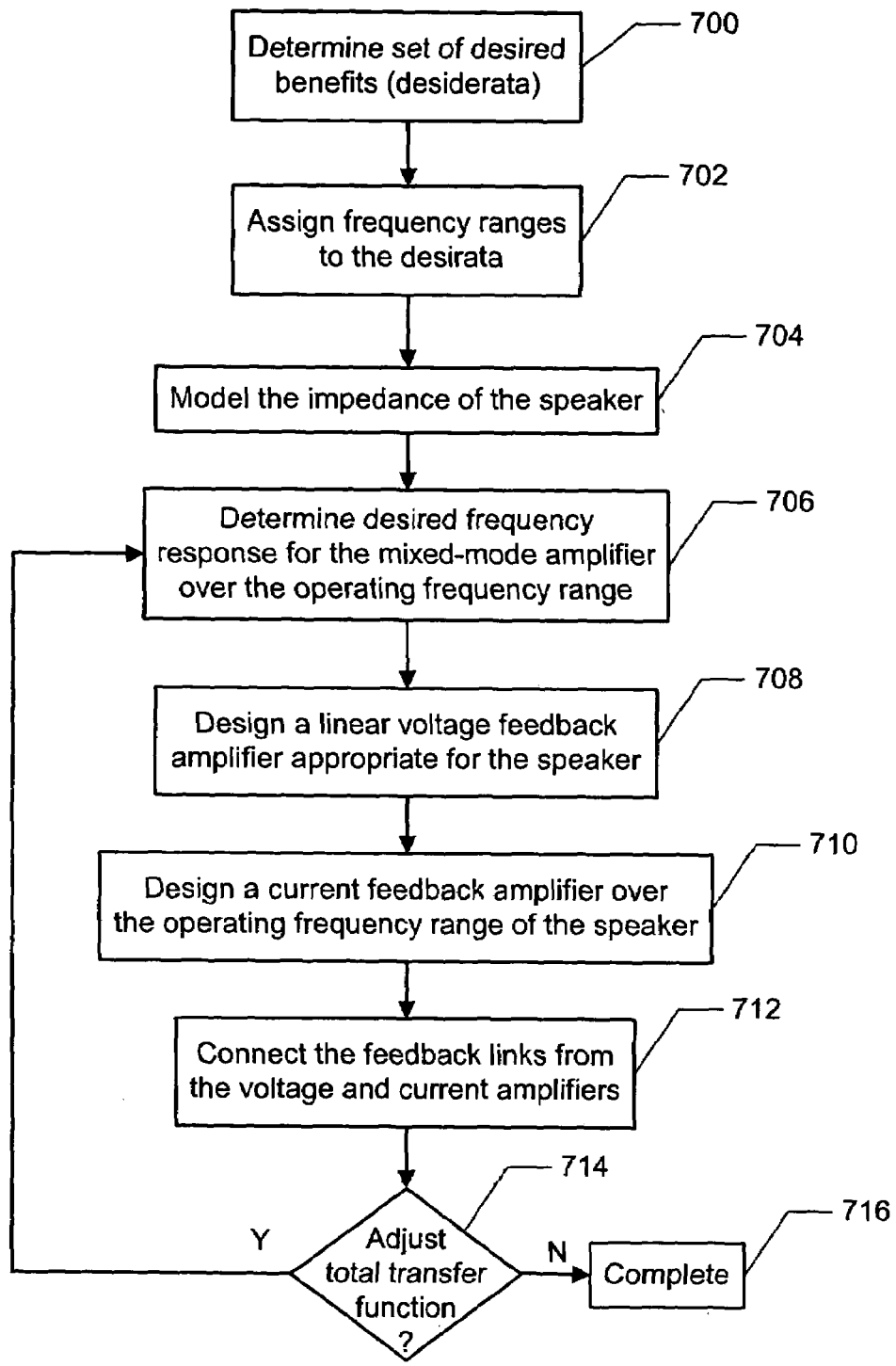
FIG. 9 is a diagram illustrating a process flow for designing a mixed-mode amplifier in accordance with the principles set forth herein.

FIG. 9 is a diagram illustrating a process flow for designing a mixed-mode amplifier in accordance with the principles set forth herein. With reference to FIGS. 6A and 9, the process begins in step 700 by determining a set of benefits that is desired once the driver 406 that is connected to the amplifier 400. This set of benefits is denoted as desiderata. The desiderata may those that would be characteristic of the driver 406 driven by a current amplifier, among which are:

1. Reduction of audio distortion arising from nonlinearities of the BEMF or voice coil inductance,
2. Reduction of current gain drift due to thermal variation in the voice coil resistance,
3. Reduced damping due to BEMF reduction,
4. Relative immunity of the current gain to changes in load impedance,
5. Reduction of the order of the ODE describing the dynamics of an audio circuit from $3^{rd}$ order to $2^{nd}$ order.

The desiderata may those that would be characteristic of the driver 406 driven by a voltage amplifier, among which are:

1. Robust stability in the presence of inductive loads,
2. Relative immunity to disturbances (e.g., electromagnetic interference) due to the fact that the feedback is localized within the amplifier,
3. Insensitivity of its voltage gain and stability properties due to parametric drift or unmodeled dynamics in the load,
4. Allows for greater damping around the mechanical resonance due to BEMF.

In step 702, the desiderata are refined such that the frequency ranges are assigned to each of the desiderata. Since over any one frequency range benefits derived from current amplifiers and voltage amplifiers cannot be simultaneously achieved, inconsistencies must resolved by either dropping the some of the desiderata, or assigning the mutually inconsistent desiderata to different frequency ranges. From this, frequency ranges are determined over which the amplifier is to act in current mode and in voltage mode and over which amplifier is made to transition from on mode to another. This implies that the set the desired benefits are matched to frequency ranges.

As an example, suppose the driver in question is a typical woofer and that are four desiderata:

1. a reduction in distortion due to nonlinearities in Le(x) by 20 dB,
2. relatively high mechanical damping at resonant frequencies,
3. a reduction in distortion due to nonlinearities in the BEMF
4. robust stability due to parametric uncertainties in the load (driver).

First, it is noted that desiderata 2 and 3 are inconsistent, since mechanical damping and distortion due to nonlinearities in the BEMF occur in a frequency range near mechanical resonance. Thus one of these two desiderata must be dropped. Suppose desideratum 2 is dropped. Then it would be natural to associate the frequency ranges to the desiderata in the set of benefits as follows:

1. a reduction in distortion due to nonlinearities in Le(x) by 20 dB, at high frequencies (500 Hz to 20 kHz)
2. a reduction in distortion due to nonlinearities in the BEMF by 30 dB, (20 Hz–200 Hz)
3. robust stability due to parametric uncertainties in the load (driver) (above 50 kHz)

From this, it is possible define the operation of a preferred embodiment of the mixed-mode amplifier:
from 0 to 20 kHz operate as a current amplifier
from 20 kHz to 50 kHz transition to voltage amplifier
above 50 kHz operate as a voltage amplifier.

In step 704, the impedance of the driver 406 is modeled. This may be done in a number of different ways. The simplest method is to model the driver as a resistor in series with an inductor, with the values of these elements determined by measuring the nominal resistance and inductance of the driver 406 coil. A more accurate model, described by the transconductance and transduction equations, requires the measurement of the nominal coil inductance and resistance, and moving mass and mechanical damping and mechanical compliance and motor factor of the driver 406. In addition, there exist driver modeling software programs, based on finite element modeling of the mechanical, electrical and magnetic properties of the driver 406. These software programs will be able to provide a dynamic model of impedance of the d river 406, as polynomial ratio in the s-domain, for example. Finally, it is possible to measure the impedance of the driver 406 directly by exciting the driver 406 with a excitation signal and measuring voltage and current simultaneously. From the measurements, a frequency domain representation of the impedance may be obtained from which a model of impedance of the driver 406 may be derived, again, as polynomial ratio in the s-domain, for example.

In step 706, a desired frequency response is determined for the mixed-mode amplifier 400 over the operating frequency range. This frequency response can be specified as one four transfer functions:
an input signal voltage to driver current transfer function,
an input signal voltage to amplifier output voltage transfer function,
an input signal current to driver current transfer function, or
an input signal current to amplifier output voltage transfer function.

If an input signal voltage to driver current transfer function is specified, the model of the impedance is used to generate the corresponding input signal voltage to output voltage transfer function, which is defined as the transfer function where the input signal voltage is the voltage applied to an inverting amplifier input and the output voltage is the voltage at the output of the operational amplifier, with the non-inverting amplifier input grounded. A similar transformation may be made where the input signal is a current. In this case the resistance of the feedforward resistor is used to generate the corresponding input signal voltage.

Figure 10:
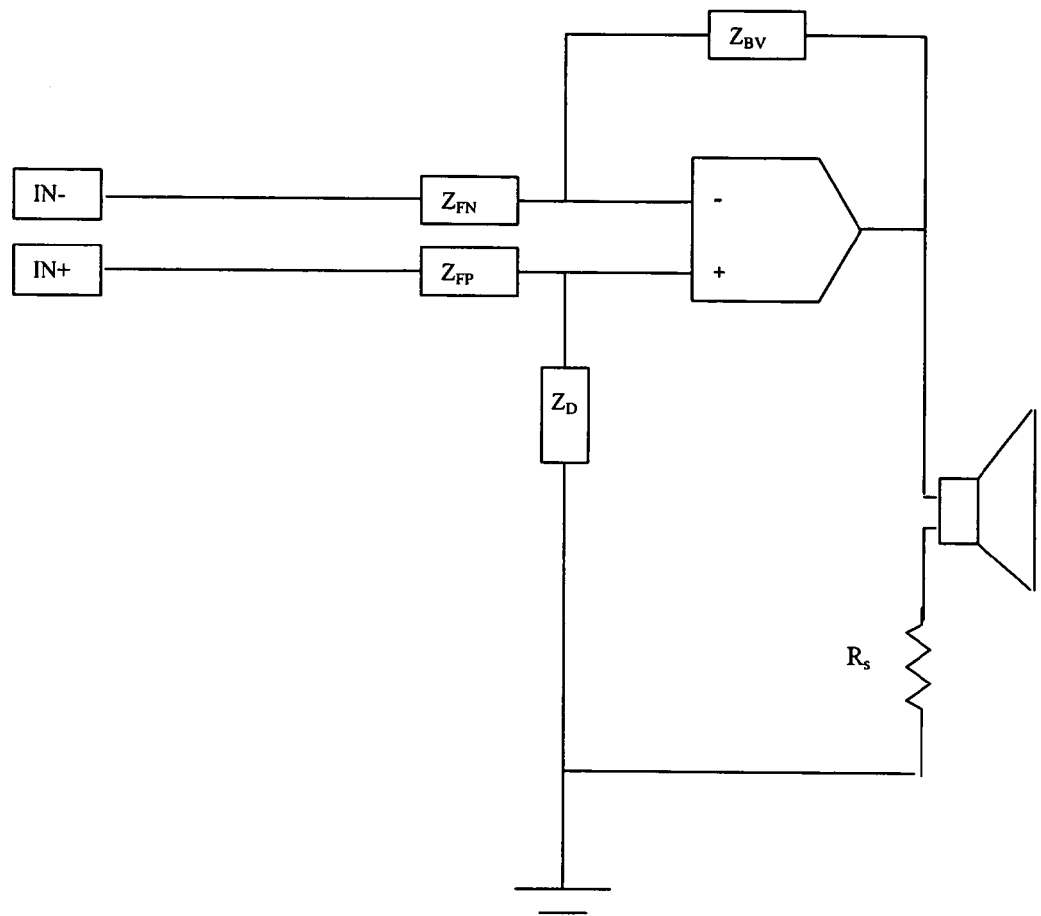
FIG. 10 is a diagram showing a circuit a topology for a voltage feedback amplifier.

FIG. 10 is a diagram showing a circuit topology for the linear voltage feedback amplifier 800 designed in step 708. The symbols $Z_{BV}$, $Z_{FN}$, $Z_{FP}$, and $Z_D$ represent effective impedances produced by passive linear circuit networks. At this step, $Z_{FP}$ should be an open circuit and $Z_D$ should be a short circuit. The magnitude of the input signal voltage to amplifier output voltage frequency response in dB should be equal to the ideal frequency response (from step 706) in those frequency ranges where the amplifier operates as a voltage amplifier. For those frequency ranges where the amplifier operates as a current amplifier the input signal voltage to amplifier output voltage frequency response in dB should be greater than the ideal frequency response (from step 706), but less than the maximum voltage gain allowable by the voltage amplifier 800 in the operating frequency range. The slope of the magnitude of the transfer function should be kept shallow enough to keep the relative phases of the current and voltage feedback transfer functions less than 180 degrees, so that when combined with the current feedback, the total transfer function remains stable and minimum phase. The degree to which the relative input signal voltage to amplifier output voltage frequency response in dB should be greater than the ideal frequency response depends on the extent to which any of the desiderata in the set of benefits require reduction in distortion or parameter drift. If one of the desiderata requires that the amount of distortion due to nonlinear inductance be reduced by 20 dB from 500 Hz to 20 kHz, then at that frequency range the magnitude of the input signal voltage to amplifier output voltage frequency response should be at least 20 dB higher than the ideal frequency response determined by step 706. In addition to the requirements stated above, the frequency response should be designed using industry standard criteria.

Figure 11:
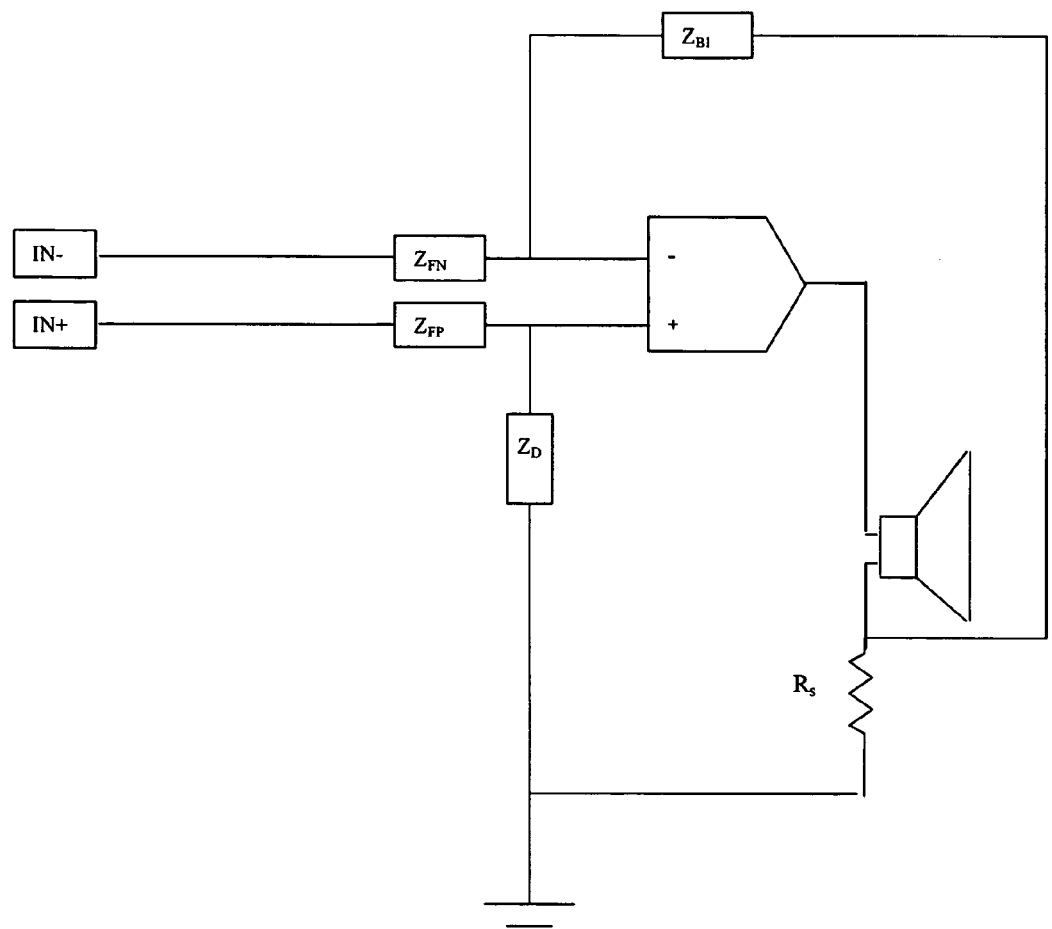
FIG. 11 is a diagram showing a circuit a topology for the current feedback amplifier.

In step 710, over the operating frequency range of the driver 406, a current feedback amplifier is designed, using the topology shown in FIG. 11. FIG. 11 is a diagram showing a circuit topology for the current feedback amplifier 802 designed in step 708. The symbol $Z_{BI}$ represents an effective impedance produced by a passive linear circuit network. Note that the feed forward networks, $Z_{FN}$, $Z_{FP}$, and $Z_D$, are the same as the voltage amplifier 800. The magnitude of the input signal voltage to amplifier output voltage frequency response in the frequency range over which the mixed-mode amplifier operates as a current amplifier should equal the ideal frequency response (from step 706). For those frequency ranges where the amplifier operates as a voltage amplifier the input signal voltage to amplifier output voltage frequency response in dB should typically be significantly greater than the ideal response (from step 706). If one of the desiderata is a specific reduction in damping at the resonance frequency, the input signal voltage to amplifier output voltage frequency response of the current amplifier should only be higher than the ideal value to an extant that would yield the required reduction in damping. The slope of the signal voltage to amplifier output voltage frequency response 500 should be chosen such that the input signal voltage to amplifier output voltage transfer function 502 of the mixed-mode amplifier is minimum phase and stable when the current feedback is added to the voltage amplifier. As described above, this may be achieved by ensuring that the relative phase of the current and voltage transfer functions 500 and 502 is less than 180 degrees.

Figure 12:
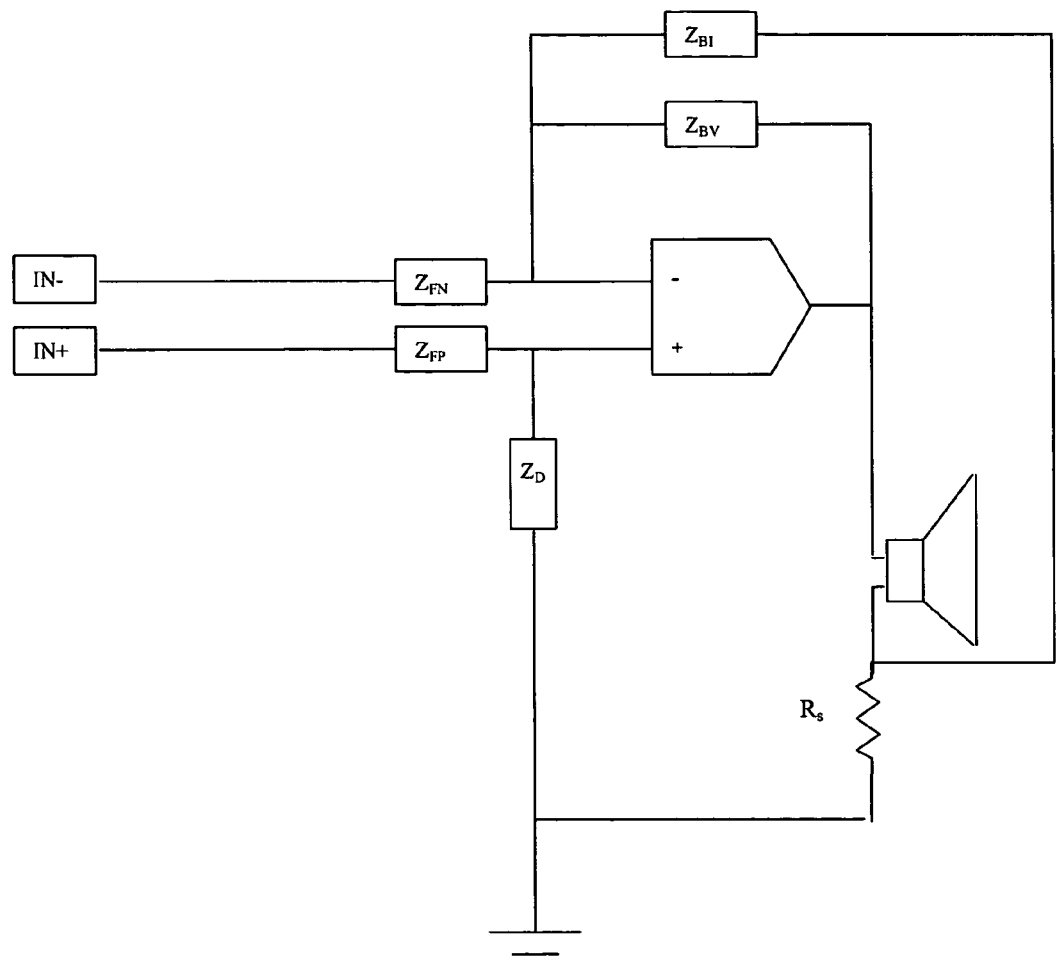
FIG. 12 is a diagram showing a circuit a topology for the finished mixed-mode amplifier.

In step 712 the two feedback paths, $Z_{BI}$ and $Z_{BV}$, from the current amplifier design and voltage amplifier design respectively, are connected as well as the common links, $Z_{FN}$, $Z_{FP}$, and $Z_D$ using the topology shown in FIG. 12. FIG. 12 is a diagram showing a circuit topology for the resulting mixed-mode amplifier 804. Also in step 712, the input signal voltage to amplifier output voltage transfer function of the mixed-mode amplifier 804 is determined. If properly designed, the phase of the total transfer function 504 will be intermediate between those of the current and voltage designs 800 and 802, as shown in FIG. 7B, and the magnitude will roughly follow the minimum magnitude of the current and voltage transfer functions 500 and 502, similar to that shown in FIG. 7A.

In step 714, if the design of the total transfer function 504 in the transition frequency range 510 needs adjusting in order that the final input voltage to output voltage transfer function of the mixed-mode amplifier, then steps 706 through 712 are iterated as needed. Otherwise, the design of the mixed-mode amplifier is complete in step 716. As a final step, if it is desired that the mixed-mode amplifier 804 operate as a non-inverting amplifier, $Z_{FP}$ and $Z_D$ can be designed to give the desired frequency response from the non-inverting input.

It should also be noted at this time that there exist a number of methods whereby the displacement of a driver cone, x, is computed by measuring the changes in the impedance Z of the voice coil. These methods typically apply a sense current being tones (sinusoids) at one or more frequencies to the voice coil and use a variety of techniques to measure the change in phase of the tone. In audio amplifiers, this tone is applied at trans-audio frequencies, in order that it not be perceived by the listener. These techniques require that the amplifier powering the driver be voltage driven at the trans-audio frequencies. One advantage of the mixed-mode amplifier is that it enables this type of measurement technique, since it allows the amplifier to act as a voltage amplifier at trans-audio frequencies.

Figure 13A:
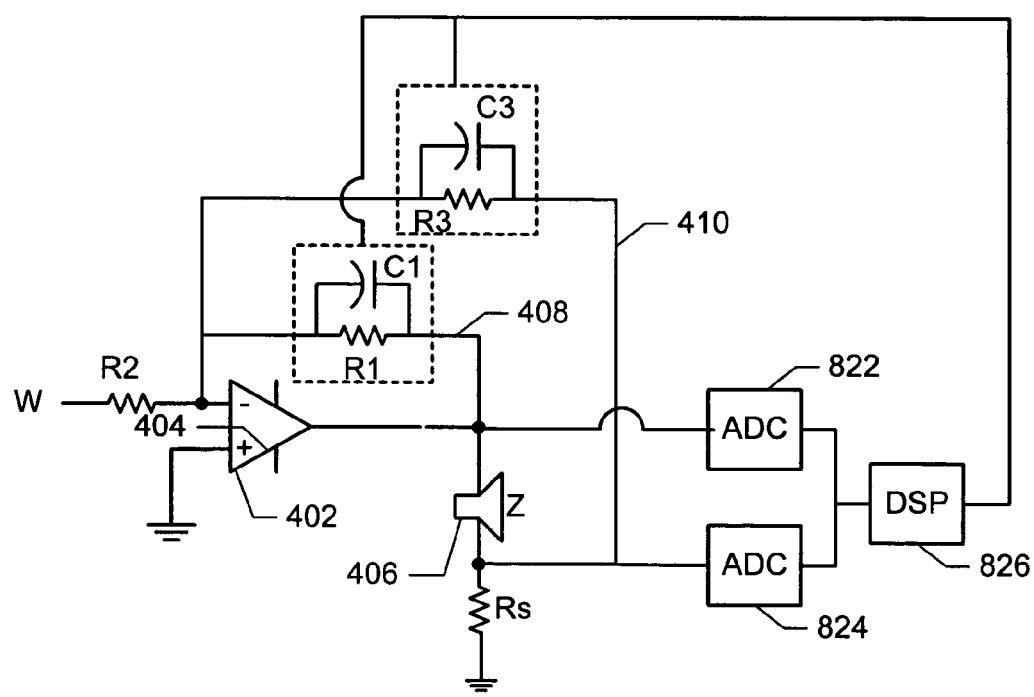
FIGS. 13A–13C are circuit diagrams illustrating three different implementations for a software-controlled mixed-mode amplifier in accordance with a further embodiment of the present invention.
Figure 13B:
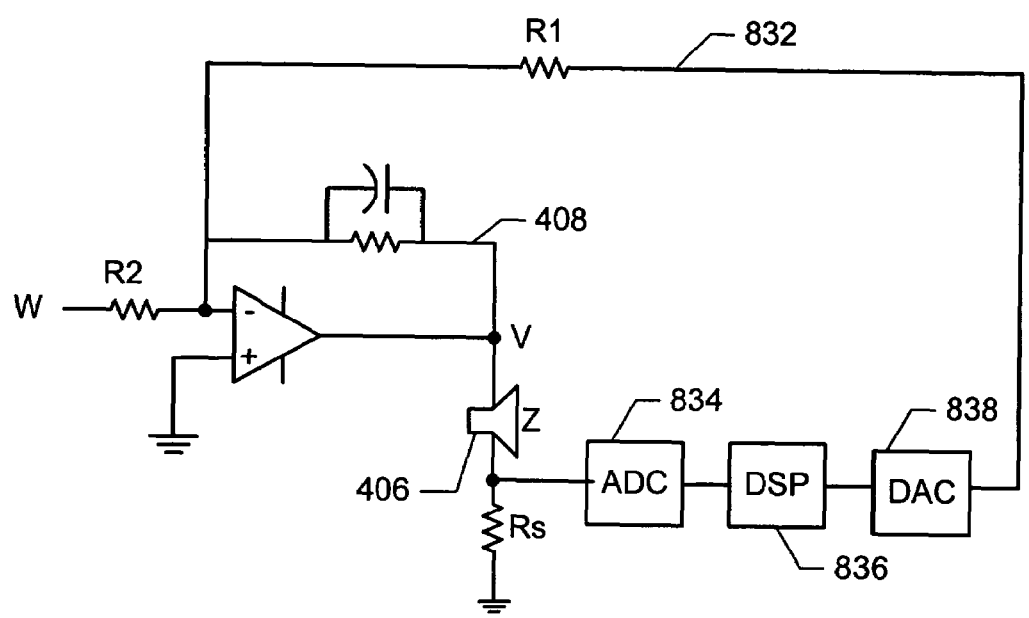
Figure 13C:
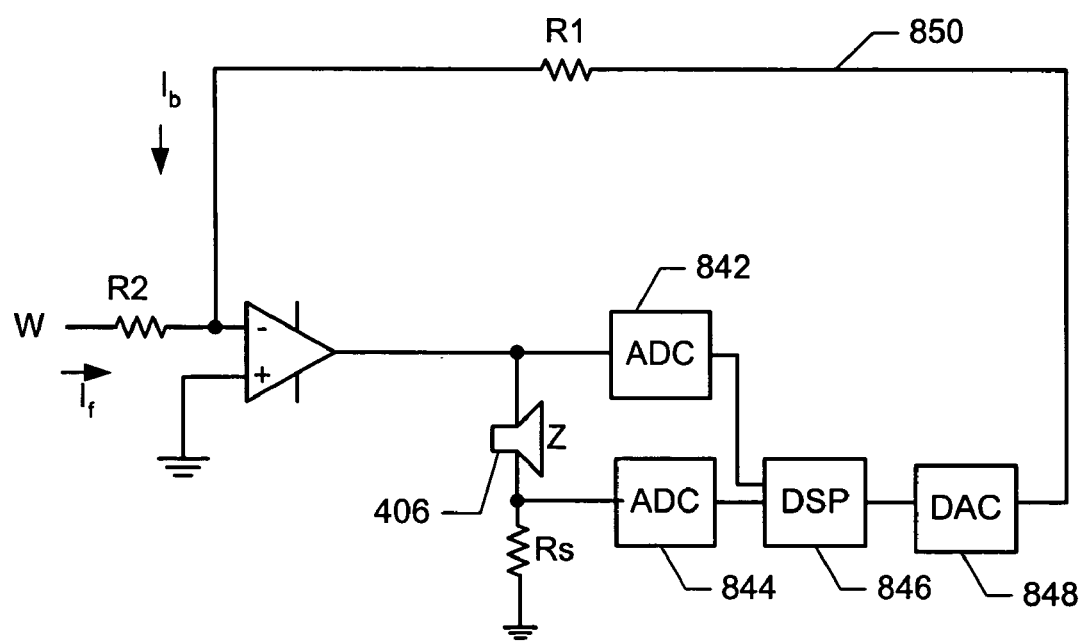

In a further embodiment of the present invention, a software-controlled mixed-mode amplifier is provided that is dynamically adjustable through software for use with different drivers having different resistances, or when the resistance of the driver is unknown. FIGS. 13A–13C are circuit diagrams illustrating three different implementations for the software-controlled mixed-mode amplifier, where like components from FIGS. 6A and 6B have like reference numerals.

Referring now to FIG. 13A, the software-controlled mixed-mode amplifier 820 includes an analog-to-digital converter (ADC) 822 coupled to input node of the driver 406 and an ADC 824 coupled to the output node of the driver 406. A digital signal processor (DSP) 826 is coupled to the ADCs 824 and 826 and the networks N1 and N2. In this embodiment, the networks N1 and N2 are implemented as adjustable circuit elements having a digital input. Such circuit elements are commonly used in digital radio technologies.

In operation, the ADCs 822 and 824 sense the resistance of the driver 406. Based on this resistance, the DSP 826 adjusts the characteristics of the networks N1 and N2 to meet the nominal design characteristics of the mixed-mode amplifier 820. Examples of the parameters that the DSP 826 can adjust include the handoff frequency 512 (e.g., from 30 kHz to 50 kHz), the ratio of current to voltage, which changes the impedance of the amplifier 802, and the gain of the amplifier 802. The DSP 826 can also be used to adjust the amount of nonlinear distortion reduced by the amplifier 820. For example, the DSP 826 can shape the impedance of the amplifier as a function of frequency so that at the resonance peak (where the BEMF is a problem) the amplifier becomes a low impedance (i.e., voltage) amplifier to increase BEMF damping.

FIG. 13B shows a second implementation for a software-controlled mixed-mode amplifier, which mixes digital and analog feedback paths. In this implementation, the amplifier 830 retains the voltage sensing feedback loop 408 comprising an RC network, but the current sensing feedback loop 832 now comprises an ADC 834, a DSP 836, and a digital-to-analog converter (DAC) 838 in series with resistor R1. Based on the current sensed by the ADC 834, the DSP 836 changes the current passed through R1.

FIG. 13C shows a third implementation for a software-controlled mixed-mode amplifier, which includes an all digital feedback path. In this implementation, the mixed-mode amplifier 840 is similar to the first implementation, which includes an analog-to-digital converter (ADC) 842 coupled to input node of the driver 406 and an ADC 844 coupled to the output node of the driver 406. A digital signal processor (DSP) 846 in series with a digital-to-analog converter (DAC) 848 and resistor R1 are coupled to the ADCs 842 and 844 to form a current and voltage feedback path 850.

The mixed-mode amplifier has been disclosed that operates substantially as a current amplifier in one frequency range, and transitions to a voltage amplifier in a frequency range above the first. The main advantages of the mixed-mode amplifier are that it reduces distortion and drift in the amplifier in the audible frequency range where it acts as a current amplifier, while inheriting the robust stability of the voltage amplifier.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A mixed-mode audio amplifier, comprising:
    a voltage sensing feedback path including a first network comprising at least one circuit;
    a current sensing feedback path including a second network comprising at least one circuit; and
    wherein the first and second networks vary properties of the amplifier as a function of frequency of an input signal, such that at a first frequency range, the amplifier operates substantially as a current amplifier, and at a second frequency range, the amplifier operates substantially as a voltage amplifier, wherein the amplifier transitions between operating as the current amplifier and the voltage amplifier in a third frequency range that does not comprise the first and second frequency ranges, thereby inheriting benefits of the current amplifier at the first frequency range and benefits of the voltage amplifier at the second frequency range.

2. The mixed-mode audio amplifier of claim 1 wherein the properties of the amplifier being varied by the first and second networks is the effective output impedance.

3. The mixed-mode audio amplifier of claim 1 wherein the properties of the amplifier being varied by the first and second networks is the output transconductance.

4. The mixed-mode audio amplifier of claim 1 wherein the properties of the amplifier being varied by the first and second networks is the relative gain between the first and second networks.

5. The mixed-mode audio amplifier of claim 1 wherein at the first frequency range, the mixed-mode audio amplifier operates with high effective output impedance, and at the second frequency range, the mixed-mode audio amplifier operates with low effective output impedance.

6. The mixed-mode audio amplifier of claim 1 wherein at the first frequency range, the mixed-mode audio amplifier operates with low effective output impedance, and at the second frequency range, the mixed-mode audio amplifier operates with high effective output impedance.

7. The mixed-mode audio amplifier of claim 5 wherein the first frequency range comprises audible frequencies and the second frequency range comprises frequencies higher than audible frequencies.

8. The mixed-mode audio amplifier of claim 6 wherein the first frequency range comprises audible frequencies and the second frequency range comprises frequencies higher than audible frequencies.

9. The mixed-mode audio amplifier of claim 1 wherein the voltage sensing feedback path and the current sensing feedback path operate in parallel.

10. The mixed-mode audio amplifier of claim 9 wherein a sum of transfer functions associated with the voltage and current sensing feedback paths produces a transfer function whose magnitude approximately follows a minimum of the magnitude of the respective transfer functions of the voltage and current sensing feedback paths.

11. The mixed-mode audio amplifier of claim 10 wherein a total gain of the amplifier is given by the expression $$\frac{1}{G_{total}} = \frac{1}{G_{current}} + \frac{1}{G_{voltage}}.$$

12. The mixed-mode audio amplifier of claim 9 wherein a sum of transfer of functions associated with the voltage and current sensing feedback paths produces a transfer function for the amplifier that is stable and minimum phase.

13. The mixed-mode audio amplifier of claim 12 wherein the transfer functions associated with the voltage and current sensing feedback paths are designed such that their ratio would be stable in a feedback configuration in order to ensure that the transfer function for the amplifier is stable and minimum phase.

14. The mixed-mode audio amplifier of claim 12 wherein the transfer functions associated with the voltage and current sensing feedback paths are designed with their relative phase less than 180 degrees in order to ensure that the transfer function for the amplifier is stable and minimum phase.

15. The mixed-mode audio amplifier of claim 1 wherein the amplifier operates over a desired frequency range with sufficiently low effective output impedance to reduce effects of uncertainty in the load on the voltage operation of the amplifier.

16. The mixed-mode audio amplifier of claim 1 further including a driver coupled to the voltage sensing feedback path and the current sensing feedback path.

17. The mixed-mode audio amplifier of claim 16 wherein the amplifier operates with sufficiently low effective output impedance around a mechanical resonance of the driver to increase damping due to BEMF.

18. The mixed-mode audio amplifier of claim 16 wherein the amplifier operates over a desired frequency range with sufficiently low effective output impedance to reduce effects of load impedance on the voltage gain of the amplifier.

19. The mixed-mode audio amplifier of claim 16 wherein the amplifier over a desired frequency range operates with sufficiently high effective output impedance to reduce distortion due to nonlinear inductance of the voice coil of the driver.

20. The mixed-mode audio amplifier of claim 16 wherein the amplifier operates over a desired frequency range with sufficiently high effective output impedance to reduce the effects of changing load impedance of the voice coil of the driver.

21. The mixed-mode audio amplifier of claim 16 wherein the amplifier operates over a desired frequency range with sufficiently high effective output impedance to reduce the effective order of the ordinary differential equation describing the audio sound reproduction.

22. The mixed-mode audio amplifier of claim 16 wherein the amplifier operates over a desired frequency range with sufficiently high effective output impedance to reduce distortion due to nonlinear behavior of the BEMF.

23. The mixed-mode audio amplifier of claim 16 wherein the amplifier over a desired frequency range with sufficiently low effective output impedance to increase robustness of the stability of the amplifier.

24. The mixed-mode audio amplifier of claim 16, which enables methods of computing a position x of the voice coil by measuring changes in the impedance of the voice coil over a desired frequency range.

25. The mixed-mode audio amplifier of claim 16 further including a compensation network coupled around the driver, wherein the impedance of the compensation network is small relative to the impedance of the voice coil of the driver for sufficiently high frequencies thereby providing the amplifier with stability at high frequencies in the case that the voltage feedback path is removed.

26. The mixed-mode audio amplifier of claim 25 wherein the compensation network comprises a network having a resistor in series with a capacitor.

27. The mixed-mode audio amplifier of claim 4 wherein adjusting the relative feedback gains of the first and second networks near the resonant frequencies of the load changes the damping due to varying the effect of the BEMF of the load.

28. The mixed-mode audio amplifier of claim 1 wherein the first and second networks each are composed of linear circuit elements such as transformers, inductors, capacitors, and resistors.

29. The mixed-mode audio amplifier of claim 1 wherein the first and second networks each are comprised of an RC network comprising a resistor coupled in parallel with a capacitor.

30. The mixed-mode audio amplifier of claim 1 wherein the properties of the voltage sensing feedback path and the current sensing feedback path are software controlled.

31. A method for designing a mixed-mode amplifier, comprising:
  (a) determining the set of desired benefits (desiderata) from current-source and voltage-source operation;
  (b) assigning frequency ranges over which the mixed-mode amplifier operates in current mode;
  (c) assigning frequency ranges over which the mixed-mode amplifier operates in voltage mode;
  (d) assigning frequency ranges over which the mixed-mode amplifier transitions between current and voltage modes;
  (e) determining a model of the impedance of the driver;
  (f) determining a desired frequency response of the mixed-mode amplifier;
  (g) designing a voltage feedback amplifier consistent with the desired mixed-mode operation;
  (h) designing a current feedback amplifier consistent with the desired mixed-mode operation; and
  (i) adding the current feedback path to the voltage amplifier to form the mixed-mode amplifier.

32. The method of claim 31 wherein step (c) further includes the step of: specifying the frequency response as either an input signal voltage to driver current transfer function, an input signal voltage to output voltage transfer function, an input signal current to driver current transfer function, or an input signal current to output voltage transfer function.

33. The method of claim 31 further including the step of: if the input signal voltage to driver current transfer function is specified, using a model of the impedance of the driver to generate a corresponding input signal voltage to output voltage transfer function.

34. The method of claim 31 wherein step (g) further includes the step of: making a magnitude of the input signal voltage to output voltage transfer function associated with the voltage sensing feedback network greater than the desired frequency response multiplied by the greater of the desired level of distortion or the desired level of drift reduction.

35. The method of claim 34 wherein the magnitude of the input signal voltage to output voltage transfer function does not exceed a maximum voltage gain allowable by the voltage amplifier.

36. The method of claim 31 wherein step (h) further includes the steps of:
  (i) In a frequency range where current feedback is dominant, making a magnitude of the input signal voltage to output voltage transfer function associated with the current sensing feedback network equal to the desired frequency response;
  (ii) In a frequency range where current feedback is not dominant, making the magnitude of the transfer function associated with the current sensing feedback network greater than the magnitude of the transfer function associated with the voltage sensing feedback network; and
  (iii) making a slope of the magnitude of the transfer function associated with the current sensing feedback network such that the input signal voltage to voltage transfer function of the mixed-mode amplifier is stable and minimum phase.

37. The method of claim 31 wherein step (e) further includes the step of: determining a model of an impedance of the driver by measuring driver coil inductance and resistance.

38. The method of claim 31 wherein step (e) further includes the step of: determining a model of an impedance of the driver by measuring driver coil inductance, resistance and moving mass and mechanical damping and mechanical compliance and motor factor.

39. The method of claim 31 wherein step (e) further includes the step of: determining a model of an impedance of the driver through a driver analysis software program.

40. The method of claim 31 wherein step (e) further includes the step of: determining a model of the impedance of the driver through voltage and current excitation and measurement over a desired frequency range.

41. The method of claim 31 further including step (i) of: iterating steps (g)–(i) to achieve a desired transfer function of the mixed-mode amplifier.

42. A mixed-mode audio amplifier, comprising:
a voltage sensing feedback path including a first network comprising at least one circuit;
a current sensing feedback path including a second network comprising at least one circuit; and
wherein the first and second networks vary properties of the amplifier as a function of frequency of an input signal, such that at a first frequency range, the amplifier operates substantially as a current amplifier, and at a second frequency range, the amplifier operates substantially as a voltage amplifier, thereby inheriting benefits of the current amplifier at the first frequency range and benefits of the voltage amplifier at the second frequency range, wherein a sum of transfer functions associated with the voltage and current sensing feedback oaths produces a transfer function whose magnitude approximately follows a minimum of the magnitude of the respective transfer functions of the voltage and current sensing feedback paths.

* * * * *

UNITED STATES PATENT AND TRADEMARK OFFICE
CERTIFICATE OF CORRECTION

PATENT NO. : 7,053,705 B2 Page 1 of 1
APPLICATION NO. : 10/744663
DATED : May 30, 2006
INVENTOR(S) : John J. Hench It is certified that error appears in the above-identified patent and that said Letters Patent is hereby corrected as shown below:

Title Page, at Item (22) Filed,

"Dec. 23, 2003"

should be

-- Dec. 22, 2003 --

Signed and Sealed this

Ninth Day of January, 2007

JON W. DUDAS
*Director of the United States Patent and Trademark Office*